United States Patent
Raley et al.

(10) Patent No.: US 11,658,038 B2
(45) Date of Patent: May 23, 2023

(54) METHOD FOR DRY ETCHING SILICON CARBIDE FILMS FOR RESIST UNDERLAYER APPLICATIONS

(71) Applicant: Tokyo Electron Limited, Tokyo (JP)

(72) Inventors: Angelique Raley, Albany, NY (US); Christopher Cole, Albany, NY (US); Qiaowei Lou, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/317,587

(22) Filed: May 11, 2021

(65) Prior Publication Data

US 2021/0358763 A1     Nov. 18, 2021

Related U.S. Application Data

(60) Provisional application No. 63/024,273, filed on May 13, 2020.

(51) Int. Cl.
*H01L 21/311*     (2006.01)
*H01L 21/033*     (2006.01)

(52) U.S. Cl.
CPC .... *H01L 21/31116* (2013.01); *H01L 21/0332* (2013.01); *H01L 21/31144* (2013.01); *H01L 21/31138* (2013.01)

(58) Field of Classification Search
None
See application file for complete search history.

(56) References Cited

U.S. PATENT DOCUMENTS

| 2002/0055265 A1* | 5/2002 | Ring ................... H01L 21/0445 257/E21.054 |
| 2004/0087166 A1* | 5/2004 | Morrow ............ H01L 21/76813 257/E21.252 |

(Continued)

FOREIGN PATENT DOCUMENTS

| CN | 1949463 A | 4/2007 |
| JP | 2009049363 A | 3/2009 |
| JP | 2012049220 A | 3/2012 |

OTHER PUBLICATIONS

Korean Intellectual Property Office, The International Search Report and Written Opinion for International Application No. PCT/US2021/031816, dated Aug. 31, 2021, 9 pages.

*Primary Examiner* — Roberts P Culbert (57) ABSTRACT

A substrate processing method is described for etching silicon carbide films for resist underlayer applications. The method includes providing a substrate containing a silicon carbide film thereon, and a photoresist layer defining a pattern over the silicon carbide film, plasma-exciting an etching gas containing a fluorocarbon-containing gas and an oxygen-containing gas, and exposing the substrate to the plasma-excited etching gas to transfer the pattern to the silicon carbide film, where at least a portion of a thickness of the photoresist layer survives the exposing. For example, the photoresist layer includes an EUV resist layer and the etching gas includes $C_4F_8$ gas, $O_2$ gas, and Ar gas. In another example, the exposing includes exposing the substrate to a) a plasma-excited etching gas containing $C_4F_8$ gas, $O_2$ gas, and Ar gas, and b) exposing the substrate to a plasma-excited Ar gas, where steps a) and b) are sequentially performed at least once.

20 Claims, 5 Drawing Sheets

(56) References Cited

U.S. PATENT DOCUMENTS

| | | |
|---|---|---|
| 2006/0157448 A1 | 7/2006 | Magni et al. |
| 2010/0203733 A1* | 8/2010 | Kanegae .......... H01L 21/76804 |
| | | 438/694 |
| 2014/0187044 A1 | 7/2014 | Tsai et al. |
| 2015/0325448 A1 | 11/2015 | Matsuoka et al. |
| 2018/0065844 A1 | 3/2018 | Imhoff et al. |

* cited by examiner

METHOD FOR DRY ETCHING SILICON CARBIDE FILMS FOR RESIST UNDERLAYER APPLICATIONS

CROSS-REFERENCE TO RELATED APPLICATIONS

This application claims priority to U.S. Provisional Patent Application No. 63/024,273, filed May 13, 2020, the disclosure of which is expressly incorporated herein, in its entirety, by reference.

FIELD OF THE INVENTION

The present invention relates to semiconductor processing, and more particularly, to a substrate processing method for etching silicon carbide (SiC) films for resist underlayer applications.

BACKGROUND OF THE INVENTION

Silicon-containing antireflection coatings (Sears) are commonly used as underlayers in lithography applications, where a pattern in a photoresist layer is transferred into the SiARC using an anisotropic dry etching process. The introduction of extreme ultraviolet (EUV) lithography and EUV resists has led to problems that include toppling over of the features of the patterned EUV resist, even when using an adhesion layer between the patterned EUV resist and the SiARC. New underlayer materials are needed that can replace SiARCs in EUV lithography, but the EUV resists must have adequate etch selectivity relative to these underlayer materials, in order to enable pattern transfer from the EUV resists into the underlayer materials.

The introduction of SiC films into EUV lithography schemes has shown promise of reducing or preventing toppling over of EUV resists and providing reduced defects. Etching of SiC films selective to EUV resists is required for optimum pattern transfer but conventional etching chemistries have not been successful in providing the required etch selectivity.

SUMMARY OF THE INVENTION

Embodiments of the invention provide a substrate processing method for etching SiC films for resist underlayer applications.

According to one embodiment, the method includes providing a substrate containing a silicon carbide film thereon, and a photoresist layer defining a pattern over the silicon carbide film, plasma-exciting an etching gas containing a fluorocarbon-containing gas and an oxygen-containing gas, and exposing the substrate to the plasma-excited etching gas to transfer the pattern to the silicon carbide film, where at least a portion of a thickness of the photoresist layer survives the exposing.

According to another embodiment, the method includes providing a substrate containing a silicon carbide film thereon, and an extreme EUV resist layer defining a pattern over the silicon carbide film, plasma-exciting an etching gas containing $C_4F_8$ gas and $O_2$ gas, exposing the substrate to the plasma-excited etching gas to transfer the pattern to the silicon carbide film, where at least a portion of a thickness of the EUV resist layer survives the exposing.

According to another embodiment, the method includes providing a substrate containing a silicon carbide film thereon, and a photoresist layer defining a pattern over the silicon carbide film, and performing an pulsed plasma etching process that transfers the pattern to the silicon carbide film by a) exposing the substrate to a plasma-excited etching gas containing a fluorocarbon-containing gas and an oxygen-containing gas, and b) exposing the substrate to a plasma-excited noble gas, where steps a) and b) are sequentially performed at least once.

According to another embodiment, the method includes providing a substrate containing a silicon carbide film thereon, and an EUV resist layer defining a pattern over the silicon carbide film, and performing an etching process that transfers the pattern to the silicon carbide film by: a) exposing the substrate to a plasma-excited etching gas containing $C_4F_8$ gas, $O_2$ gas, and Ar gas, and b) exposing the substrate to a plasma-excited Ar gas, where steps a) and b) are sequentially performed at least once.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION OF SEVERAL EMBODIMENTS

Embodiments of the invention describe substrate processing methods for etching SiC films for resist underlayer applications. According to one embodiment, a pulsed plasma-etching process using an etching gas containing a fluorocarbon-containing gas, an oxygen-containing gas, and noble gas provides adequate selectivity of etching a SiC film to etching an EUV resist layer. In one example, the etching gas contains $C_4F_8$ gas, $O_2$ gas, and Ar gas. This unexpected etch selectivity is in contrast with other reported SiC plasma etch processes where many have focused on $SF_6$, $NF_3$, and chlorine-containing gases. The inventors studied the effect of various other etch chemistries on the selectivity of SiC films to EUV resist layers. The etch chemistries that were studied included $BCl_3/O_2/Ar$, $CF_4/CHF_3$, $NF_3/H_2$, $HBr/Ar$, $H_2/Cl_2/Ar$, $CF_4/H_2/Ar$, $NF_3/Ar/C_4F_6$, $BCl_3/Ar$, $C_4F_6/Cl_2/Ar$, $Ar/Cl_2$, $CF_4/Ar$, $Cl_2/Ar$, and $NF_3/Ar/CH_4$. In contrast to the successful $C_4F_8/O_2/Ar$ etch chemistry, all the above etch chemistries completely removed the EUV resist layers while the SiC films were only partially etched. It particular, it was observed that the use of $Cl_2$ gas and $NF_3$ gas was too reactive towards the EUV resist layers.

Figure 1A:
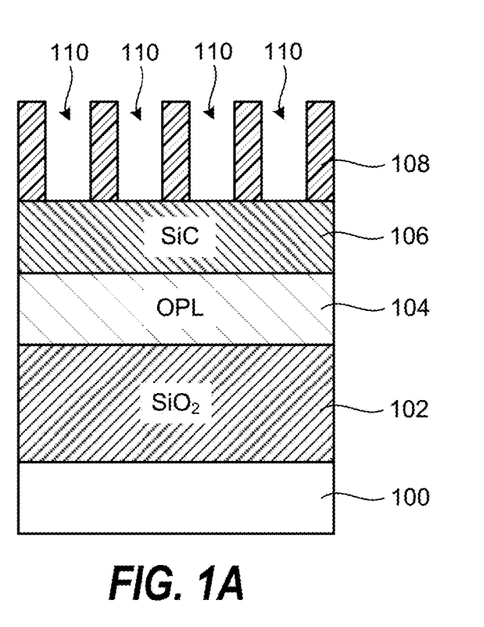
FIGS. 1A-1D schematically show through cross-sectional views a method of processing a substrate according to an embodiment of the invention.

FIGS. 1A-1D schematically shows through cross-sectional view a method of processing a substrate according to an embodiment of the invention. FIG. 1A shows a film stack 1 containing a base layer 100, a $SiO_2$ film 102, an organic planarization layer (OPL) 104, a SiC film 106, and a patterned photoresist layer 108 containing etched openings 110 that expose the underlying SiC film 106. The patterned photoresist layer 108 may be formed using conventional lithography and etching methods. In one example, the patterned photoresist layer 108 may contain an EUV resist layer that is suitable for use with EUV radiation, for example radiation centered around about 13.5 nm. In another example, the OPL may be replaced by or augmented by a spin- or carbon layer or by an amorphous carbon deposited by chemical vapor deposition (CVD).

According to one embodiment, the SiC film 106 may be formed on the OPL 104 using spin coating technology, where a liquid containing a silicon carbide precursor (e.g., a precursor containing $R_1$—Si—$CH_2$—Si—$R_2$ components) is delivered onto an upper surface of a rotating substrate (wafer). Thereafter, the substrate may undergo one or more heat-treating (baking) processes to cure the SiC film 106.

Figure 1B:
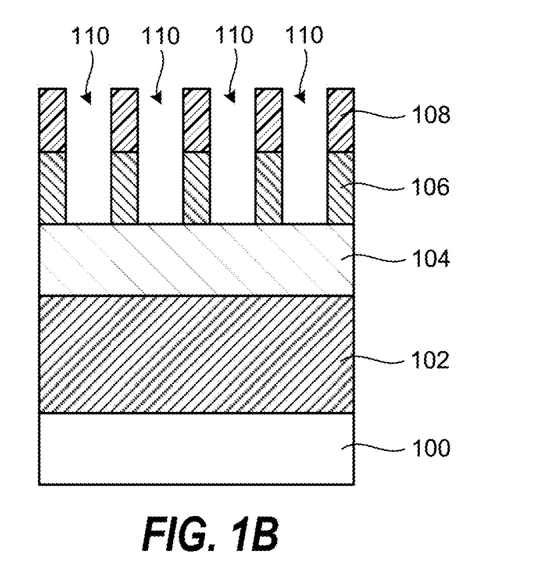
Figure 1C:
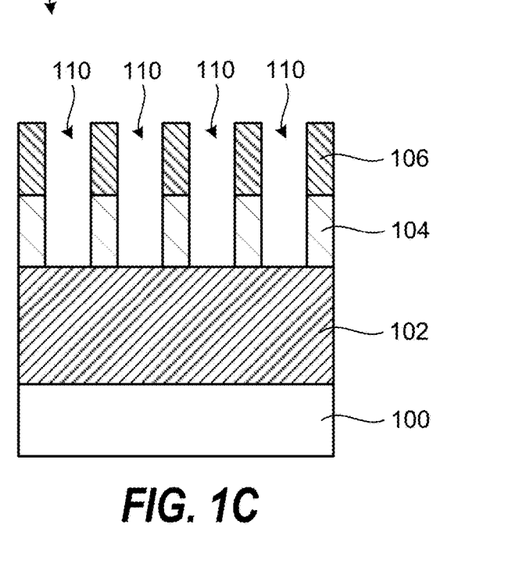
Figure 1D:
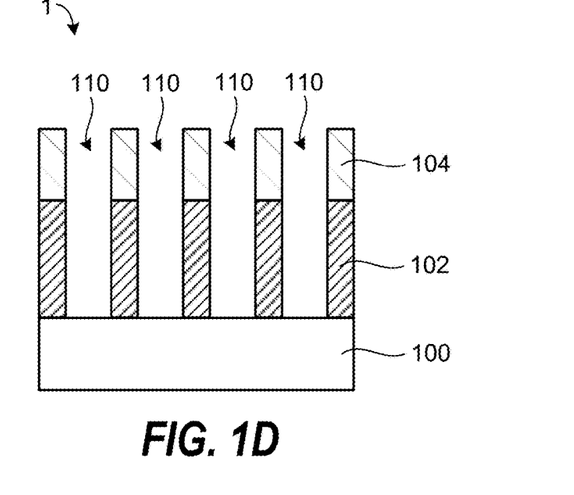

FIG. 1B shows the film stack 1 following a SiC plasma etching process that transfers the pattern of the photoresist layer 108 into and through a thickness of the SiC film 106. In this example, the SiC plasma etching process stops on the OPL 104. According to one embodiment, the SiC plasma etching process includes flowing an etching gas into a process chamber, plasma-exciting the etching gas using a plasma source, and exposing the substrate to the plasma-excited etching gas to transfer the pattern to the silicon carbide film 106, where at least a portion of a thickness of the photoresist layer 108 survives the SiC plasma etching process.

According to embodiments of the invention, the etching gas includes a fluorocarbon-containing gas and an oxygen-containing gas. The fluorocarbon-containing gas can contain a fluorocarbon gas (i.e., a $C_xF_z$ gas, where x and z are integers), a hydrofluorocarbon gas (i.e., a $C_xH_yF_z$ gas, where x, y, and z are integers), or both. In some examples, the fluorocarbon gas can include $C_4F_8$ or $C_4F_6$. The oxygen-containing gas can, for example, contain $O_2$ gas, CO gas, $CO_2$ gas, $SO_2$ gas, or a combination thereof. In one example, the fluorocarbon-containing can contain $C_4F_8$ gas and the oxygen-containing gas can contain $O_2$ gas. The etching gas can further include a noble gas, for example argon gas (Ar) or helium (He) gas. In one example, the etching gas includes or consists of $C_4F_8$ gas, $O_2$ gas, and Ar gas.

According to one embodiment, the selectivity of etching the SiC film 106 relative to etching the photoresist layer 108 is greater than 1:1. According to another embodiment, the selectivity of etching the SiC film 106 layer relative to etching the photoresist layer 108 is greater than 2:1. According to another embodiment, the selectivity of etching the SiC film 106 layer relative to etching the photoresist layer 108 is greater than 2.5:1.

According to one embodiment, the SiC plasma etching process may be performed by continuously exposing the substrate to the plasma-excited etching gas, including the fluorocarbon-containing gas, the oxygen-containing gas, and the noble gas.

According to another embodiment, the SiC plasma etching process may be performed by exposing the substrate to a pulsed plasma-excited etching gas. In one example, the exposing includes exposing the substrate to the plasma-excited etching gas, and exposing the substrate to a plasma-excited noble gas, wherein the exposing steps are sequentially performed.

Figure 2:
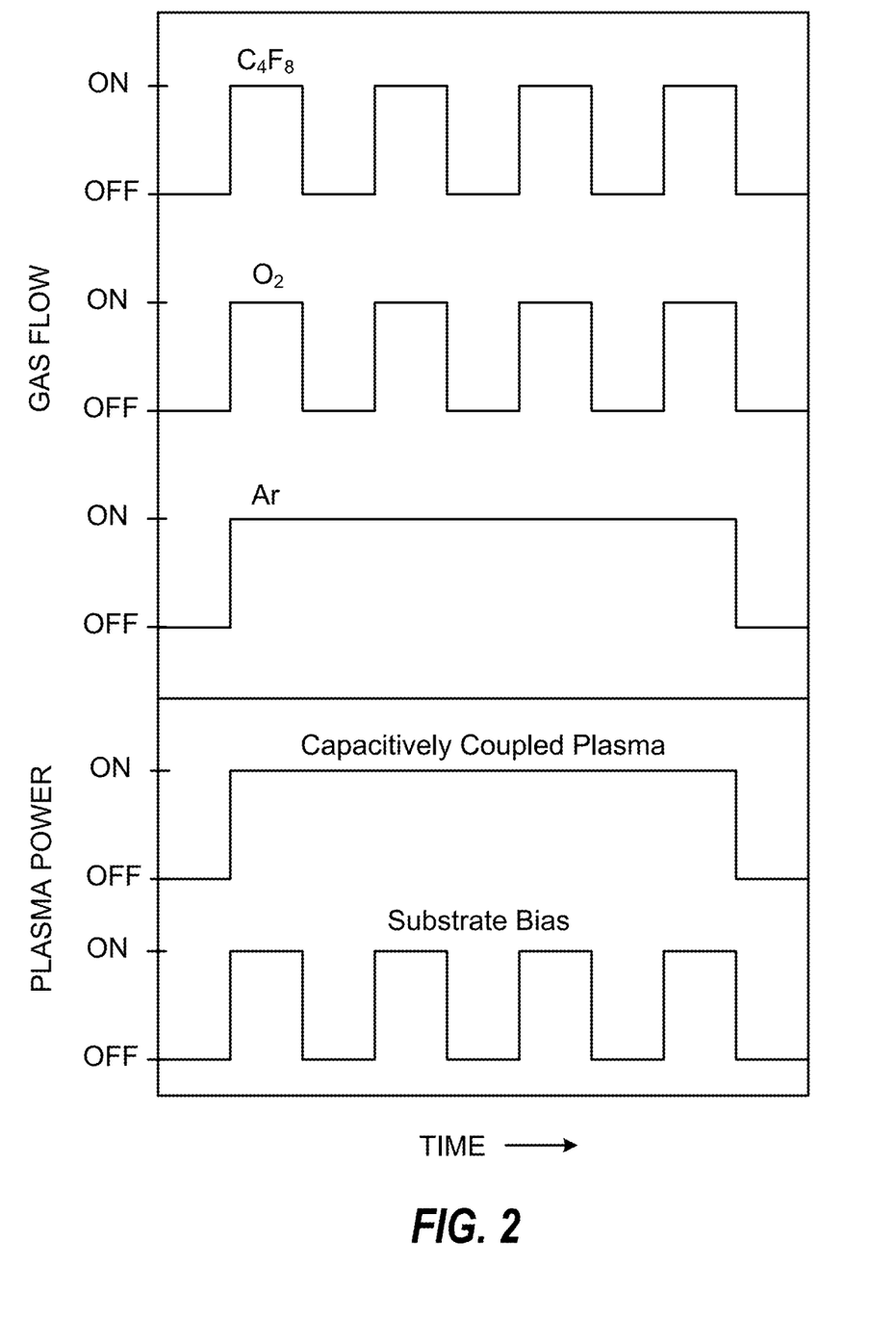
FIG. 2 is a schematic gas flow and plasma power chart for a pulsed SiC etching process according to an embodiment of the invention.

FIG. 2 is a schematic gas flow and plasma power chart for a pulsed SiC etching process according to an embodiment of the invention. The fluorocarbon-containing gas (e.g., $C_4F_8$), the oxygen-containing gas (e.g., $O_2$) are simultaneously pulsed as indicated by the ON-OFF gas flow periods, and the noble gas (e.g., Ar) is flowed in a continuous mode into the process chamber. The duration of the ON gas flow periods relative to the duration of the OFF gas flow periods may be tuned to optimize the pulsed SiC etching process and the pattern transfer.

In the embodiment shown in FIG. 2, a capacitively couple plasma (CCP) source may be used that provides continuous power to an upper electrode above the substrate, for example at 60 MHz, and additional pulsed plasma excitation may be provided, for example at 40 MHz, by applying substrate bias power to a substrate holder that supports the substrate. The substrate bias power ON-OFF cycles overlap with the ON-OFF gas flow periods of the fluorocarbon-containing gas and the oxygen-containing gas. Four etch cycles are schematically shown in FIG. 2 but the method is not so limited and any number of etch cycles needed for etching the SiC film may be used.

Following the transfer of the pattern of the photoresist layer 108 through a thickness of the SiC film 106, further processing of the film stack 1 can include additional plasma etching processes to transfer of the pattern through the OPL 104 (FIG. 1C), through the $SiO_2$ film 102 (FIG. 1D), and stopping on the base layer 100.

Figure 3A:
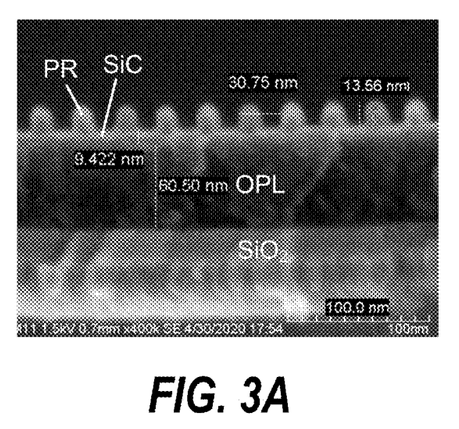
FIGS. 3A-3D show cross-sectional scanning electron microscopy (SEM) images of a film stack containing a SiC film used as a EUV resist underlayer according to an embodiment of the invention.
Figure 3B:
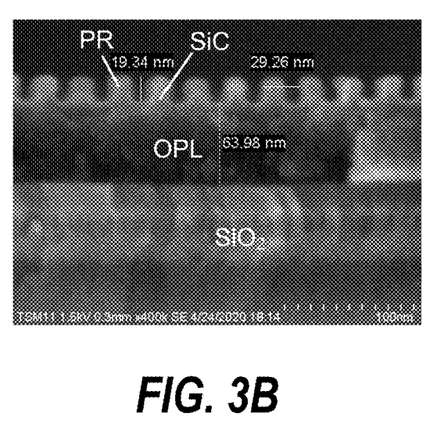
Figure 3C:
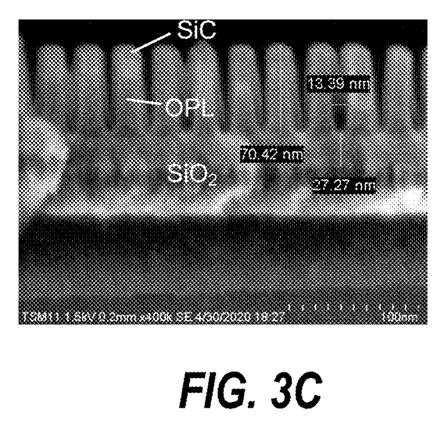

FIGS. 3A-3D show cross-sectional SEM images of a film stack containing a SiC film used as a EUV resist underlayer according to an embodiment of the invention. The film stack in FIG. 3A is similar to the film stack 1 in FIG. 2A and contains a patterned EUV resist layer (PR) having a thickness of about 13.5 nm overlying a SiC film having a thickness of about 9.4 nm, an OPL under the SiC film, and a $SiO_2$ film under the OPL. FIG. 3B shows the film stack following plasma etching transfer of the EUV resist pattern into and through the SiC film. The pattern was transferred through the entire SiC film, with about 10 nm remaining of the thickness of the patterned EUV resist layer. This corresponds to a selectivity of etching the SiC film relative to etching the EUV resist layer of about 2.6. In other words, the SiC film etched about 2.6 times faster than the EUV resist layer. The pulsed SiC plasma etching process included pulsing an etching gas of 10 sccm of $C_4F_8$ gas, 6 sccm of $O_2$ gas, and 1000 sccm of Ar gas for a time period of 3 seconds, while supplying 100 W of 60 MHz power to an upper electrode above the substrate. This was followed by a time period of 6 seconds while flowing 1000 sccm of only Ar gas, and not the $C_4F_8$ gas or the $O_2$ gas, while supplying 100 W of 60 MHz power to the upper electrode and 100 W of 40 MHz substrate bias power. The cycling was performed 7 times, the process chamber was 30 mTorr, and the substrate holder temperature was about 30° C. The result in FIG. 3B demonstrates the selectivity of the etching of the SiC film to etching the EUV resist layer that is needed for implementing SiC films into EUV resist lithography applications.

Figure 3D:
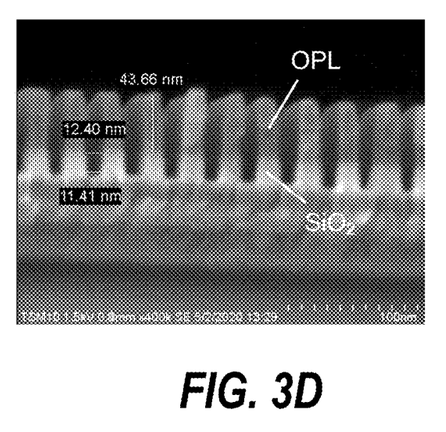

Following the transfer of the pattern of the EUV resist layer through a thickness of the SiC film, further processing of the film stack included plasma etching transfer of the pattern through the OPL (FIG. 3C), and through the $SiO_2$ film (FIG. 3D).

Exemplary SiC etching conditions include a substrate temperature between about −10° C. and about 100° C., gas pressure between about 5 mTorr and about 60 mTorr, upper electrode RF power between about 100 W and about 1000 W, substrate bias power between about 20 W and about 150 W, Ar gas flow between about 50 sccm and about 1000 sccm, $C_xF_z$ gas or $C_xH_yF_z$ gas flow between about 2 sccm and about 20 sccm, and an oxygen-containing gas flow between about 2 sccm and about 40 sccm.

Figure 4:
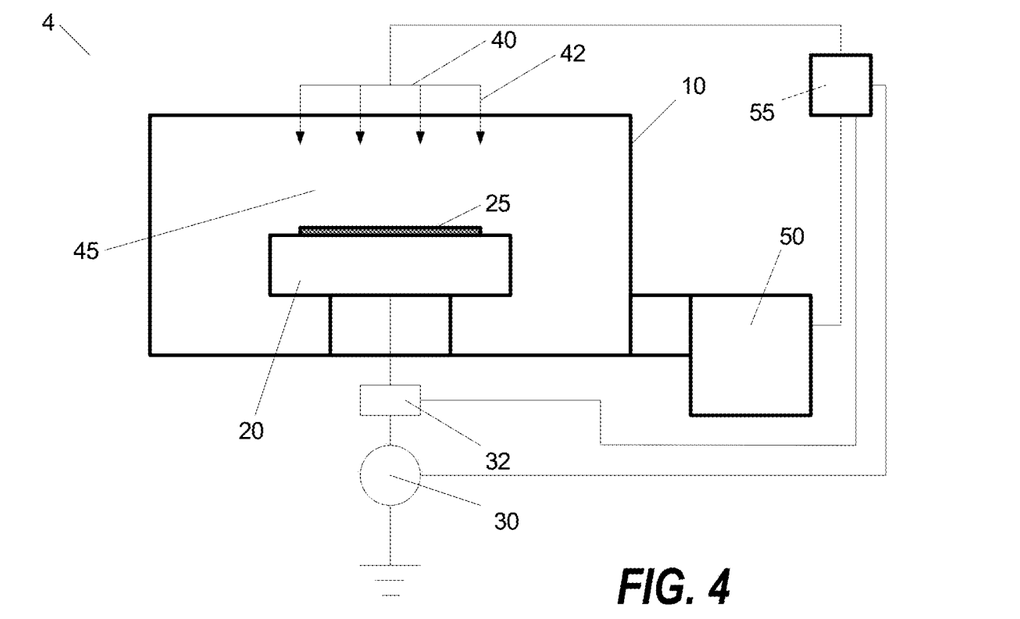
FIGS. 4-7 shows plasma processing systems for etching SiC films according to embodiments of the invention.

FIGS. 4-7 shows plasma processing systems for etching SiC films according to embodiments of the invention. According to one embodiment, FIG. 4 shows a plasma processing system 4 that includes a chamber 10, a substrate holder 20, upon which a substrate 25 to be processed is affixed, a gas injection system 40, and a vacuum pumping system 50. The chamber 10 is configured to facilitate the generation of plasma in a processing region 45 adjacent a surface of substrate 25, where plasma is formed via collisions between heated electrons and an ionizable gas. An ionizable gas or mixture of gases is introduced via the gas injection system 40 and the process pressure is adjusted. For example, a gate valve (not shown) is used to throttle the vacuum pumping system 50. The plasma is utilized to create plasma-excited gaseous species for the removal of material from the exposed surfaces of the substrate 25.

The substrate 25 is transferred into and out of chamber 10 through a slot valve (not shown) and chamber feed-through (not shown) via robotic substrate transfer system where it is received by substrate lift pins (not shown) housed within substrate holder 20 and mechanically translated by devices housed therein. Once the substrate 25 is received from the substrate transfer system, it is lowered to an upper surface of the substrate holder 20.

In an alternate embodiment, the substrate 25 is affixed to the substrate holder 20 via an electrostatic clamp (not shown). Furthermore, the substrate holder 20 further includes a cooling system including a re-circulating coolant flow that receives heat from the substrate holder 20 and transfers heat to a heat exchanger system (not shown), or when heating, transfers heat from the heat exchanger system. Moreover, gas may be delivered to the back-side of the substrate to improve the gas-gap thermal conductance between the substrate 25 and the substrate holder 20. Such a system is utilized when temperature control of the substrate is required at elevated or reduced temperatures. For example, temperature control of the substrate may be useful at temperatures in excess of the steady-state temperature achieved due to a balance of the heat flux delivered to the substrate 25 from the plasma and the heat flux removed from substrate 25 by conduction to the substrate holder 20. In other embodiments, heating elements, such as resistive heating elements, or thermo-electric heaters/coolers are included.

As shown in FIG. 4, the substrate holder 20 further serves as an electrode through which RF power is coupled to a plasma in the processing region 45. For example, the substrate holder 20 is electrically biased at a RF voltage via the transmission of RF power from an RF generator 30 through an impedance match network 32 to the substrate holder 20. The RF bias serves to heat electrons and, thereby, form and maintain plasma. In this configuration, the system operates as a reactive ion etch (ME) reactor, wherein the chamber and upper gas injection electrode serve as ground surfaces. A typical frequency for the RF bias ranges from 1 MHz to 100 MHz, and may be 13.56 MHz.

In one example, RF power is applied to the substrate holder electrode at multiple frequencies. Furthermore, the impedance match network 32 serves to maximize the transfer of RF power to a plasma in processing chamber 10 by minimizing the reflected power. Match network topologies (e.g. L-type, π-type, T-type, etc.) and automatic control methods are known in the art.

A process gas (etching gas) 42 is introduced to the processing region 45 through the gas injection system 40. Gas injection system 40 can include a showerhead, wherein the process gas 42 is supplied from a gas delivery system (not shown) to the processing region 45 through a gas injection plenum (not shown), a series of baffle plates (not shown) and a multi-orifice showerhead gas injection plate (not shown).

Vacuum pump system 50 preferably includes a turbo-molecular vacuum pump (TMP) capable of a pumping speed up to 5000 liters per second (and greater) and a gate valve for throttling the chamber pressure. In conventional plasma processing devices utilized for dry plasma etch, a 1000 to 3000 liter per second TMP is employed. TMPs are useful for low pressure processing, typically less than 50 mTorr. At higher pressures, the TMP pumping speed falls off dramatically. For high pressure processing (i.e., greater than 100 mTorr), a mechanical booster pump and dry roughing pump are used.

A computer 55 includes a microprocessor, a memory, and a digital I/O port capable of generating control voltages sufficient to communicate and activate inputs to the plasma processing system 4 as well as monitor outputs from the plasma processing system 4. Moreover, the computer 55 is coupled to and exchanges information with the RF generator 30, the impedance match network 32, the gas injection system 40 and the vacuum pump system 50. A program stored in the memory is utilized to activate the inputs to the aforementioned components of a plasma processing system 4 according to a stored process recipe.

Figure 5:
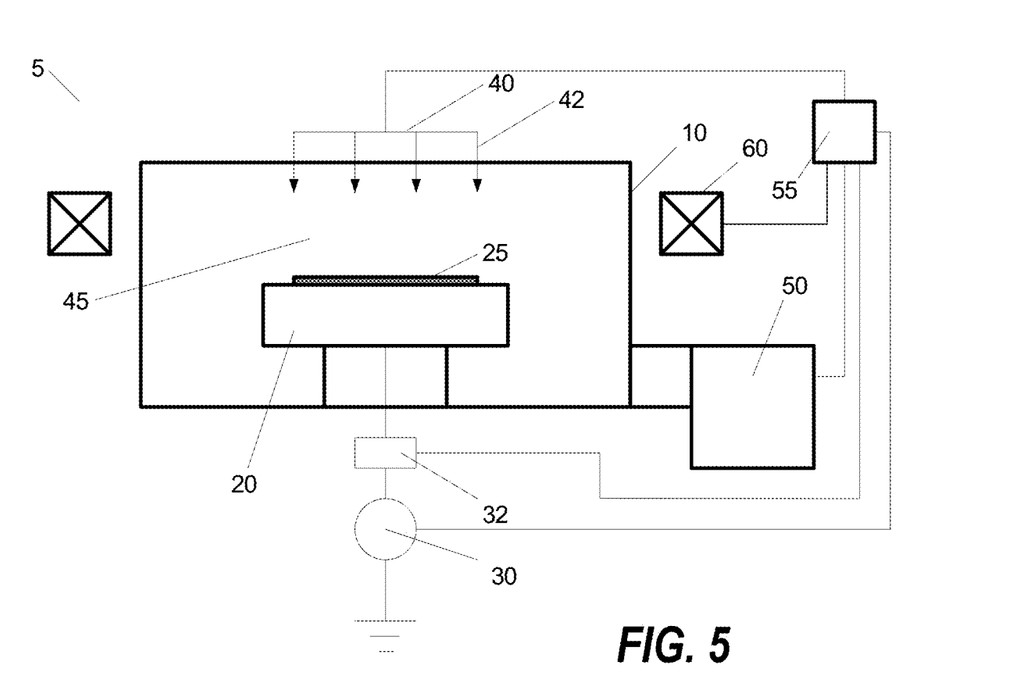

In a second embodiment, shown in FIG. 5, the plasma processing system 5 further includes either a mechanically or electrically rotating dc magnetic field system 60, in order to potentially increase plasma density and/or improve plasma processing uniformity, in addition to those components described with reference to FIG. 4. Moreover, the computer 55 is coupled to the rotating magnetic field system 60 in order to regulate the speed of rotation and field strength.

Figure 6:
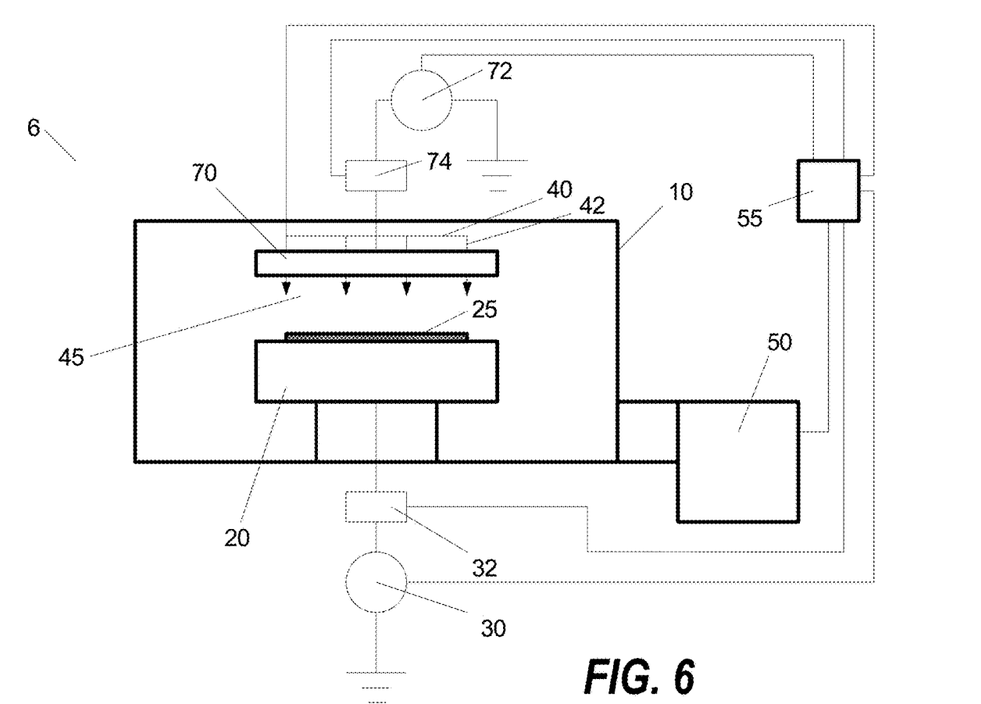

In a third embodiment, shown in FIG. 6, the plasma processing system 5 further includes an upper plate electrode 70 to which RF power is coupled from an RF generator 72 through an impedance match network 74, in addition to those components described with reference to FIG. 4. A typical frequency for the application of RF power to the upper electrode ranges from 10 MHz to 200 MHz, and can be 60 MHz. Additionally, a typical frequency for the application of power to the lower electrode ranges from 0.1 MHz to 60 MHz, and can be 40 MHz. Moreover, the computer 55 is coupled to the RF generator 72 and the impedance match network 74 in order to control the application of RF power to the upper electrode 70.

Figure 7:
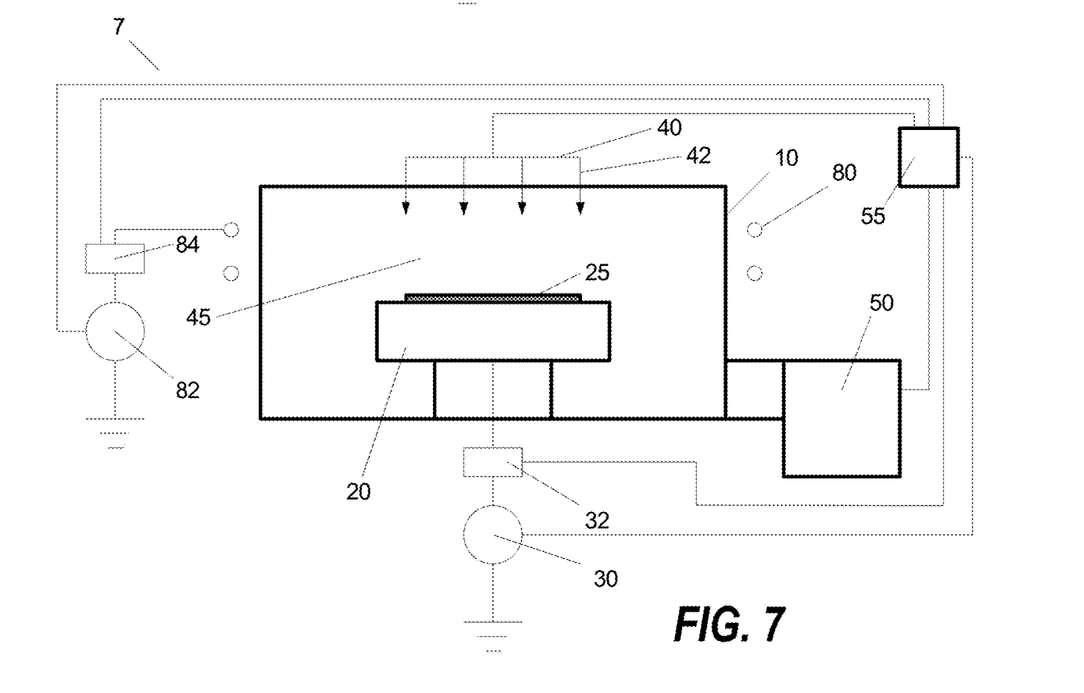

In a fourth embodiment, shown in FIG. 7, the plasma processing system 7 further includes an inductive coil 80 to which RF power is coupled via an RF generator 82 through an impedance match network 84, in addition to those components described with reference to FIG. 4. RF power is inductively coupled from the inductive coil 80 through a dielectric window (not shown) to the plasma processing region 45. A typical frequency for the application of RF power to the inductive coil 80 ranges from 10 MHz to 100 MHz, and can be 13.56 MHz. In addition, a slotted Faraday shield (not shown) is employed to reduce capacitive coupling between the inductive coil 80 and plasma. Moreover, the computer 55 is coupled to the RF generator 82 and the impedance match network 84 in order to control the application of power to the inductive coil 80.

In an alternate embodiment, the plasma is formed using electron cyclotron resonance (ECR). In yet another embodiment, the plasma is formed from the launching of a Helicon wave. In yet another embodiment, the plasma is formed from a propagating surface wave.

A plurality of embodiments for etching SiC films for resist underlayer applications have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A substrate processing method, comprising:
    providing a substrate containing a silicon carbide film thereon, and a photoresist layer defining a pattern over the silicon carbide film;
    plasma-exciting an etching gas containing a fluorocarbon-containing gas and an oxygen-containing gas; and
    exposing the substrate to the plasma-excited etching gas to transfer the pattern to the silicon carbide film, wherein at least a portion of a thickness of the photoresist layer survives the exposing, and wherein the exposing includes performing a pulsed gas etching process, comprising:
        a) exposing the substrate to the plasma-excited etching gas, and
        b) exposing the substrate to a plasma-excited noble gas, wherein steps a) and b) are sequentially performed at least once.

2. The method of claim 1, wherein the selectivity of etching the silicon carbide film relative to etching the photoresist layer is greater than 1:1.

3. The method of claim 1, wherein the selectivity of etching the silicon carbide film relative to etching the photoresist layer is greater than 2:1.

4. The method of claim 1, wherein the selectivity of etching the silicon carbide film relative to etching the photoresist layer is greater than 2.5:1.

5. The method of claim 1, wherein the fluorocarbon-containing gas includes a fluorocarbon gas, a hydrofluorocarbon gas, or both.

6. The method of claim 1, wherein the fluorocarbon-containing gas includes a fluorocarbon gas.

7. The method of claim 6, wherein the fluorocarbon gas contains $C_4F_8$ gas, $C_4F_6$ gas, or a combination thereof.

8. The method of claim 1, wherein the oxygen-containing gas includes $O_2$ gas, CO gas, $CO_2$, $SO_2$ gas, or a combination thereof.

9. The method of claim 1, wherein the etching gas further includes Ar gas.

10. The method of claim 1, wherein the photoresist layer includes an extreme ultra-violet (EUV) resist layer.

11. The method of claim 1, wherein the substrate further includes an optical planarization layer under the silicon carbide film.

12. The method of claim 11, wherein the pulsed gas etching process stops on the optical planarization layer.

13. A substrate processing method, comprising:
    providing a substrate containing a silicon carbide film thereon, and an extreme ultra-violet (EUV) resist layer defining a pattern over the silicon carbide film;
    plasma-exciting an etching gas containing $C_4F_8$ gas and $O_2$ gas; and
    exposing the substrate to the plasma-excited etching gas to transfer the pattern to the silicon carbide film, wherein at least a portion of a thickness of the EUV resist layer survives the exposing, and wherein the exposing includes performing a pulsed gas etching process:
        a) exposing the substrate to the plasma-excited etching gas, and
        b) exposing the substrate to a plasma-excited Ar gas, wherein steps a) and b) are sequentially performed at least once.

14. The method of claim 13, wherein the selectivity of etching the silicon carbide film relative to etching the EUV resist layer is greater than 1:1.

15. The method of claim 13, wherein the selectivity of etching the silicon carbide film relative to etching the EUV resist layer is greater than 2:1.

16. The method of claim 13, wherein the selectivity of etching the silicon carbide film relative to etching the EUV resist layer is greater than 2.5:1.

17. A substrate processing method, comprising:
    providing a substrate containing a silicon carbide film thereon, and an extreme ultra-violet (EUV) resist layer defining a pattern over the silicon carbide film; and
    performing a pulsed plasma etching process that transfers the pattern to the silicon carbide film by:
        a) exposing the substrate to a plasma-excited etching gas containing $C_4F_8$ gas, $O_2$ gas, and Ar gas, and
        b) exposing the substrate to a plasma-excited Ar gas, wherein steps a) and b) are sequentially performed at least once.

18. The method of claim 17, wherein the selectivity of etching the silicon carbide film relative to etching the EUV resist layer is greater than 1:1.

19. The method of claim 17, wherein the selectivity of etching the silicon carbide film relative to etching the EUV resist layer is greater than 2:1.

20. The method of claim 17, wherein the selectivity of etching the silicon carbide film relative to etching the EUV resist layer is greater than 2.5:1.

* * * * *